US006176265B1

(12) United States Patent
Takahashi et al.

(10) Patent No.: US 6,176,265 B1
(45) Date of Patent: Jan. 23, 2001

(54) VALVE UNIT HAVING AN INSERT MOLDED INNER VALVE BLOCK

(75) Inventors: Kiyoshi Takahashi, 17-25 Hirai 7-chome, Edogawa-ku; Kazuo Takahashi, both of Tokyo (JP)

(73) Assignee: Kiyoshi Takahashi, Tokyo (JP)

( * ) Notice: Under 35 U.S.C. 154(b), the term of this patent shall be extended for 0 days.

(21) Appl. No.: 08/747,245

(22) Filed: Nov. 12, 1996

(30) Foreign Application Priority Data

Nov. 14, 1995 (JP) .................................................. 7-319729
Aug. 9, 1996 (JP) .................................................. 8-227553

(51) Int. Cl.⁷ ...................................................... F16K 11/07
(52) U.S. Cl. ........................ 137/625.48; 137/375; 251/363
(58) Field of Search .............................. 251/315.15, 358, 251/367, 309, 315.05, 366; 137/625.48, 375

(56) References Cited

U.S. PATENT DOCUMENTS

| 3,342,205 | * | 9/1967 | Quinto ................................. 137/375 |
| 3,819,149 | * | 6/1974 | Kinder ......................... 251/315.15 X |
| 3,961,770 | * | 6/1976 | Wrasman .................... 251/315.15 X |
| 3,990,675 | * | 11/1976 | Bonafous ............................ 251/148 |
| 4,304,252 | * | 12/1981 | Stanton ............................... 137/240 |
| 4,488,573 | * | 12/1984 | Runyan et al. ............. 251/315.15 X |
| 4,553,562 | * | 11/1985 | Nakada .............................. 251/366 X |
| 4,696,323 | * | 9/1987 | Iff ...................................... 251/367 X |
| 4,697,787 | * | 10/1987 | Pelleboer ........................ 251/315.15 |
| 5,799,986 | * | 9/1998 | Corbett et al. .......................... 285/55 |

FOREIGN PATENT DOCUMENTS

| 402076980 | * | 3/1990 | (JP) ................................. 251/315.15 |
| 3-50672 | | 8/1991 | (JP) . |
| 5-75554 | | 10/1993 | (JP) . |
| 087005373 | * | 9/1987 | (WO) . |

* cited by examiner

Primary Examiner—John Fox
(74) Attorney, Agent, or Firm—Skjerven, Morrill, MacPherson, Franklin & Friel LLP; Alan H. MacPherson; Gary J. Edwards

(57) ABSTRACT

Pick-up tools and other devices for handling semiconductor wafers are require to be capable of withstanding corrosive chemical substances and extreme temperatures, and the valve unit for use in such devices must meet these requirements. The valve unit is also desired to be free from electrostatic charging. To this end, the valve unit comprises a valve main body, having a valve seat defined therein, which is made of relatively electroconductive and self-lubricating material such as PTFE, and a valve case which is injection molded around the valve unit and made of a material having some electroconductivity and a high resistance against deformation such as PEEK mixed with carbon fibers. Provision of annular grooves on the outer surface of the valve main body improves the attachment between the valve main body and the valve case so as to improve both the sealing performance and the mechanical integrity of the valve unit.

23 Claims, 13 Drawing Sheets

Fig. 1
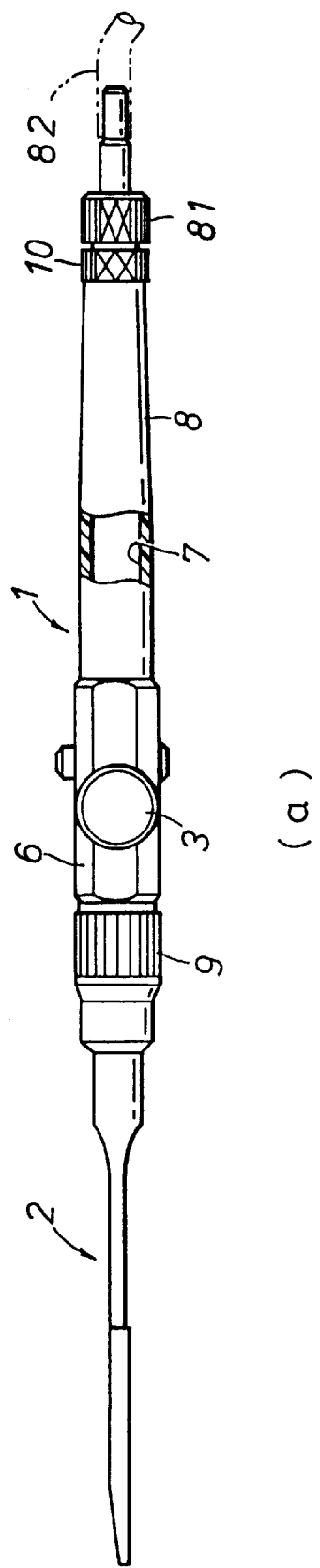
(a)
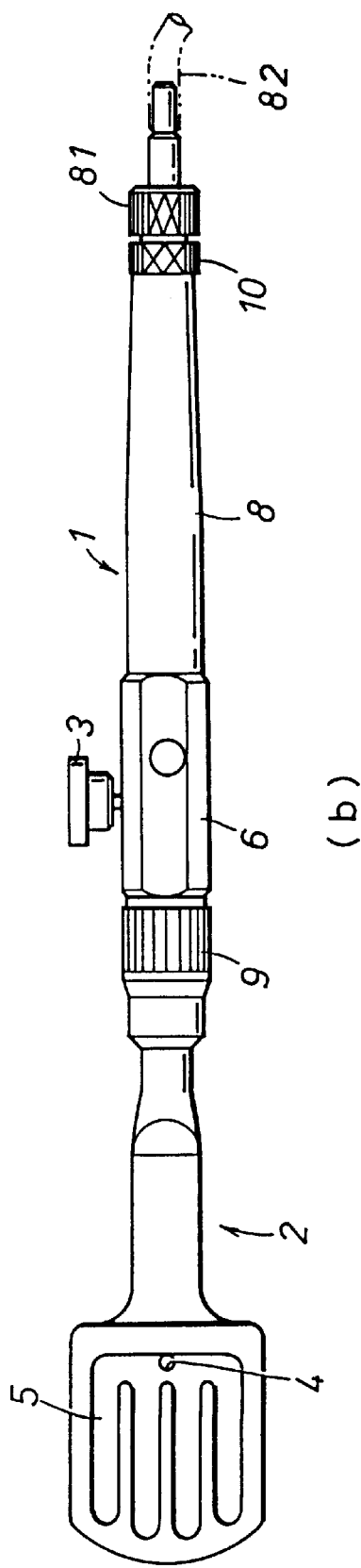
(b)

Fig. 2
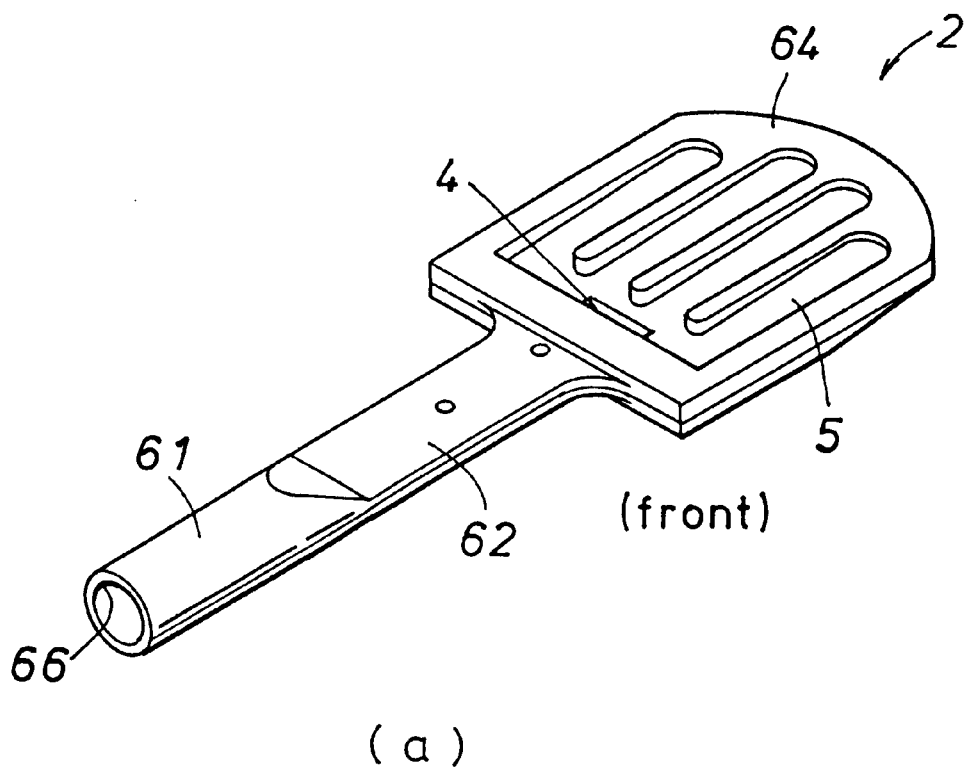
(a)
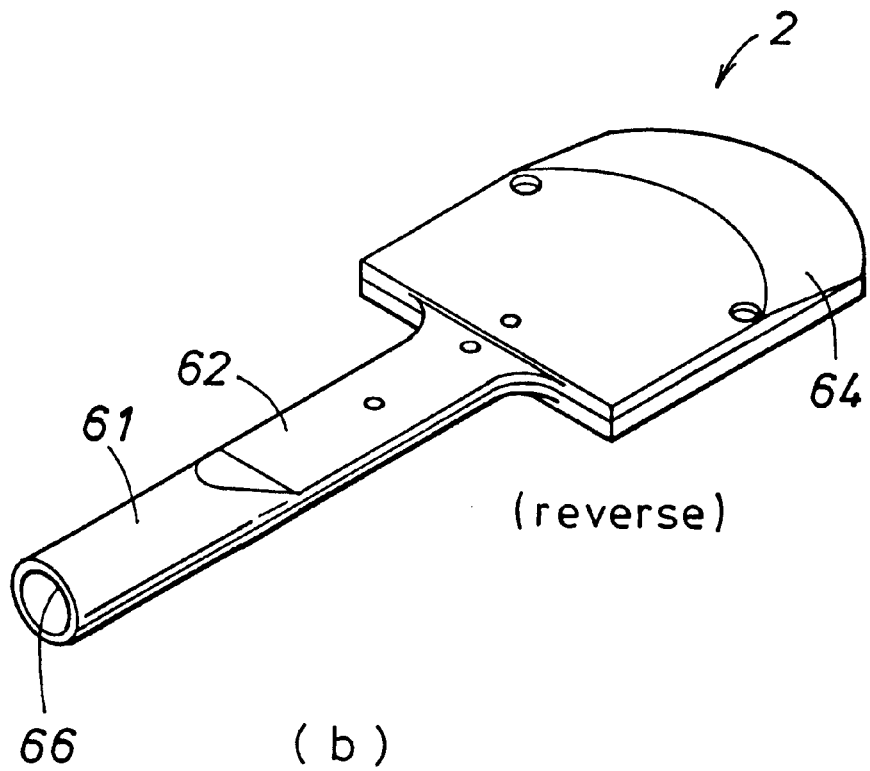
(b)

Fig. 3
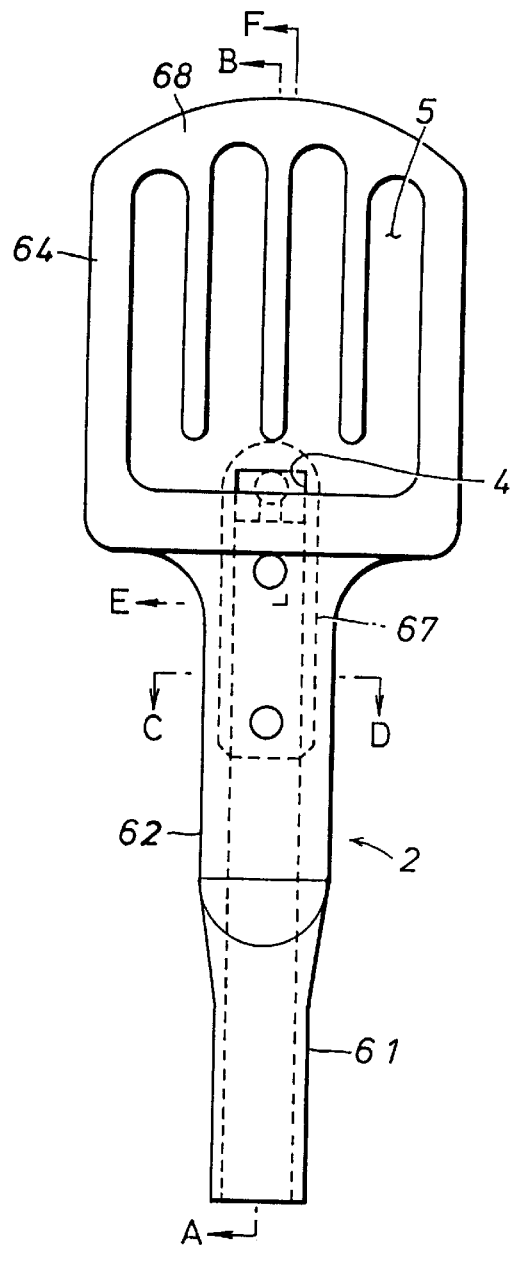
(a)
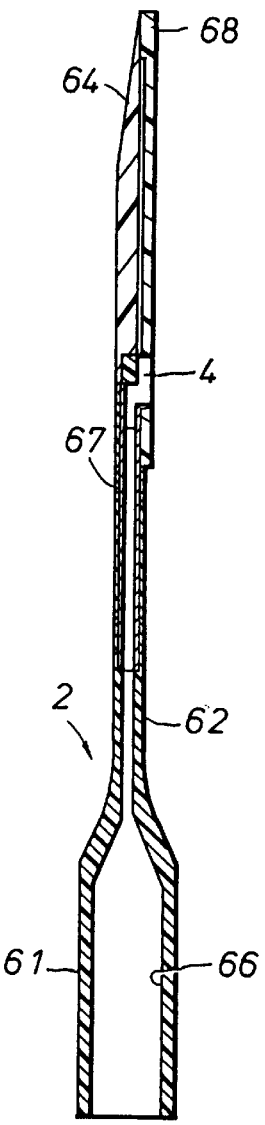
(b)
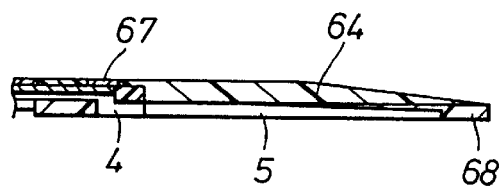
(c)
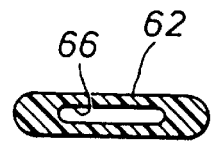
(d)

Fig. 6
(a)
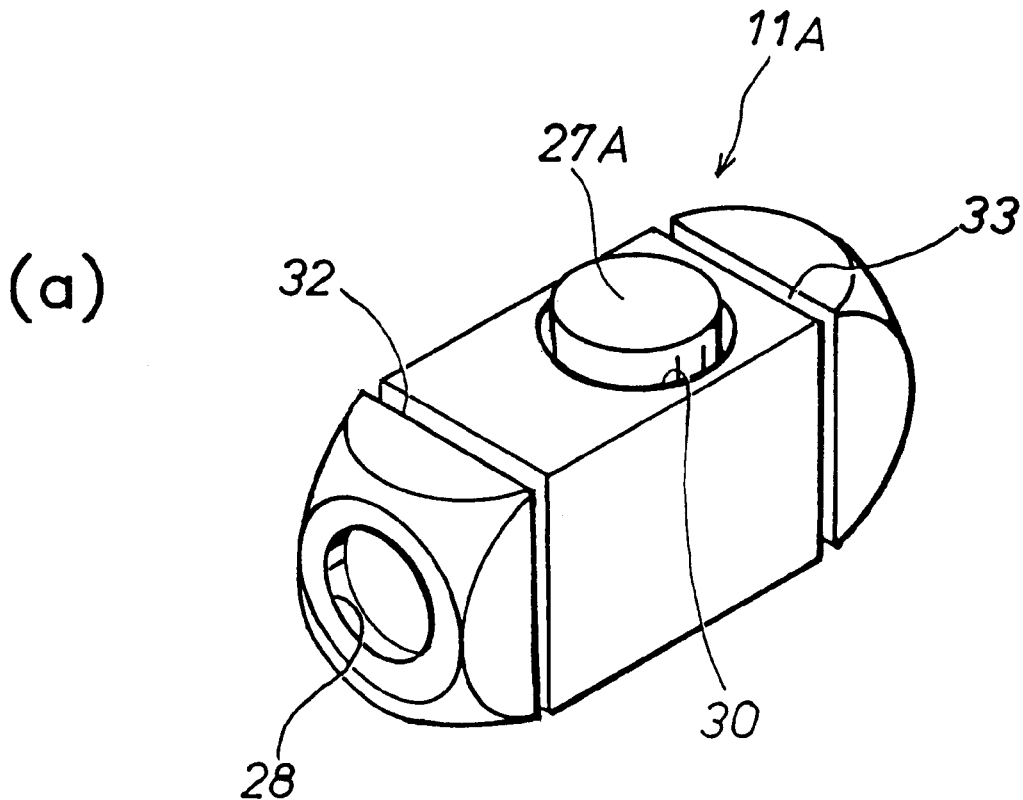
(b)
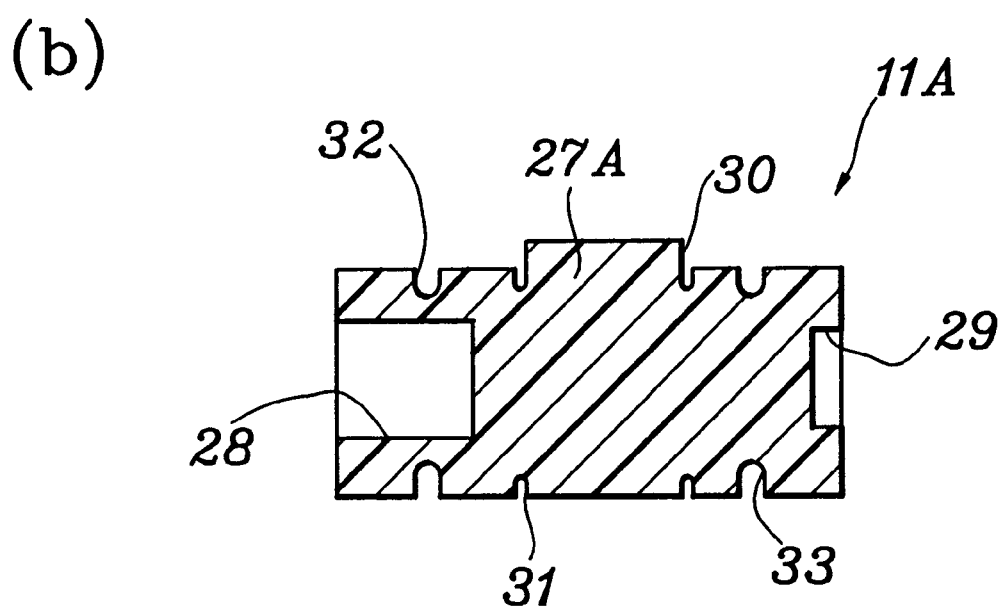

Fig. 9
(a)
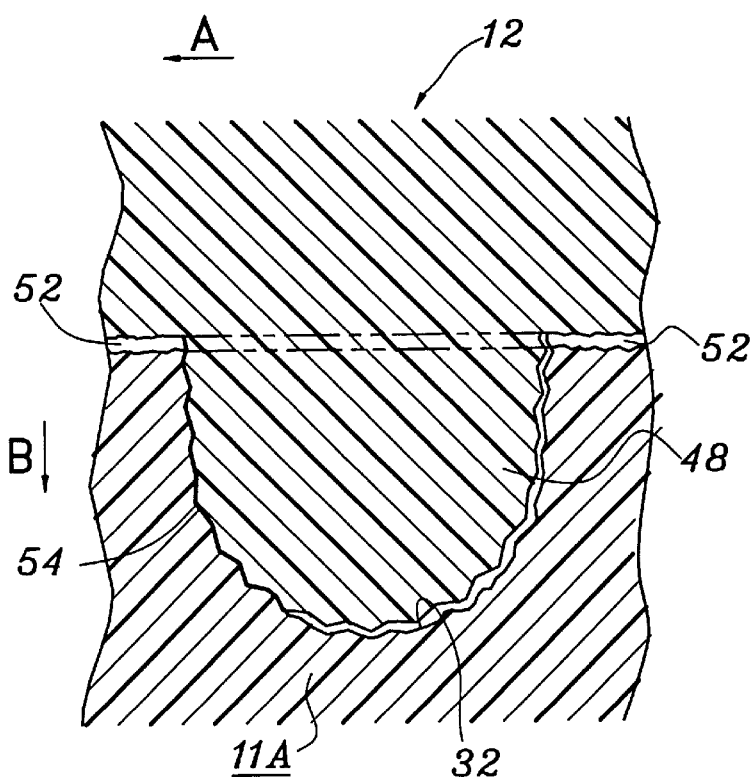
(b)
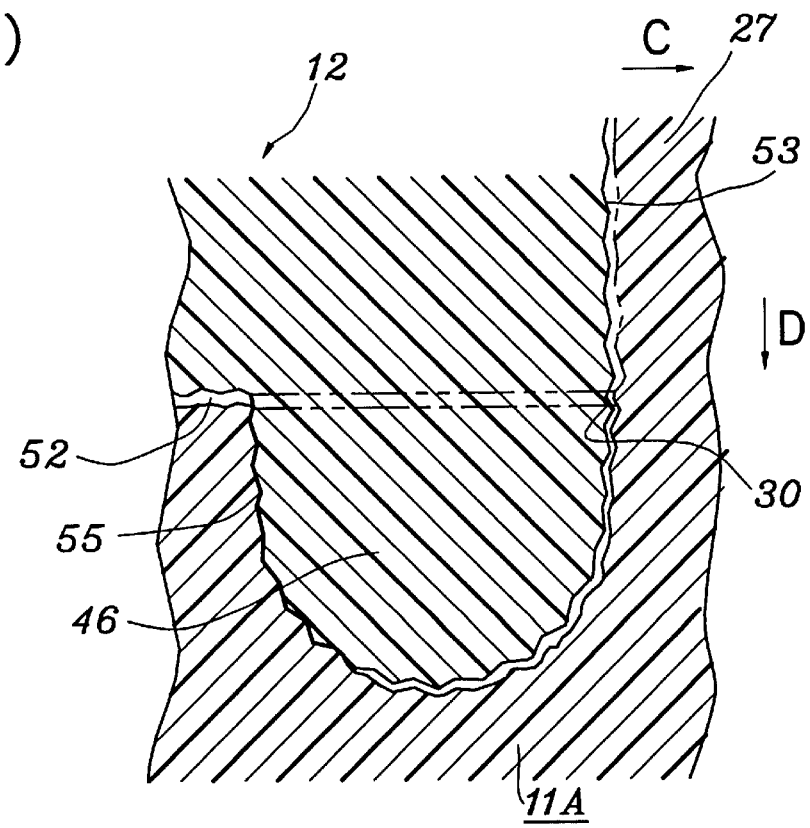

Fig.11
(a)
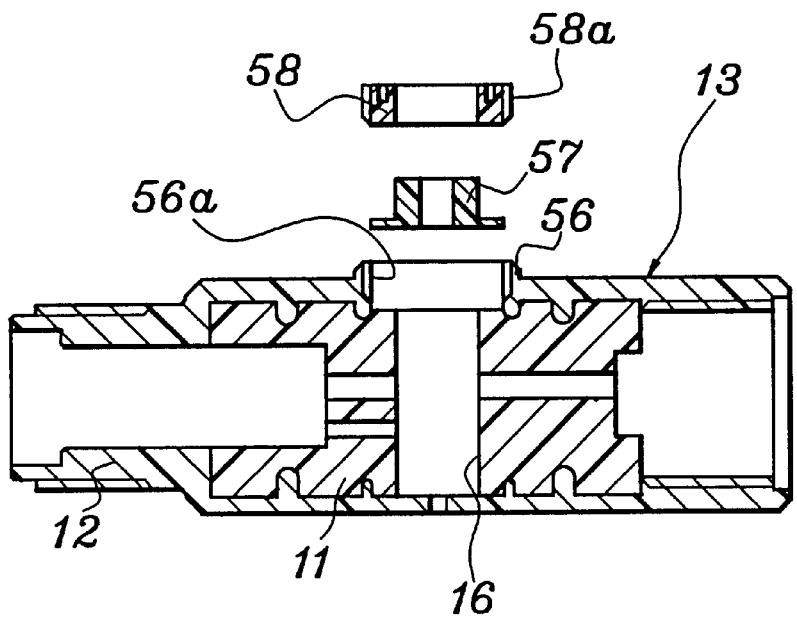
(b)
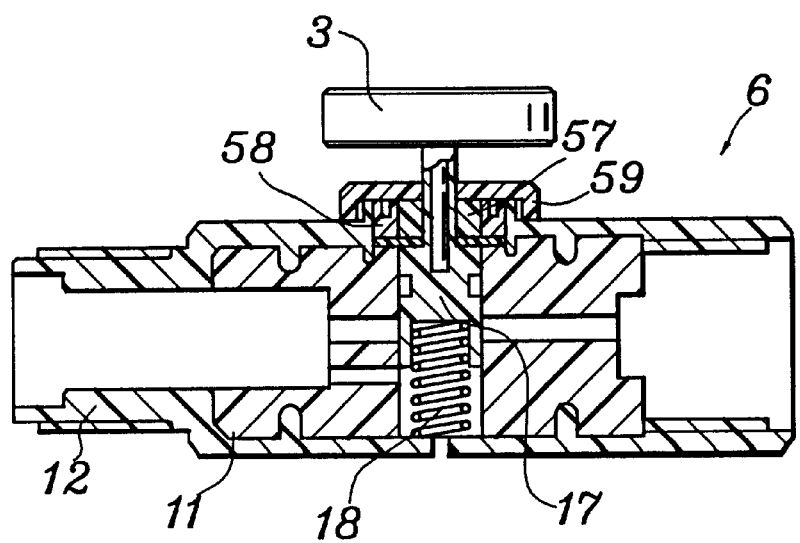

Fig. 13
(a)
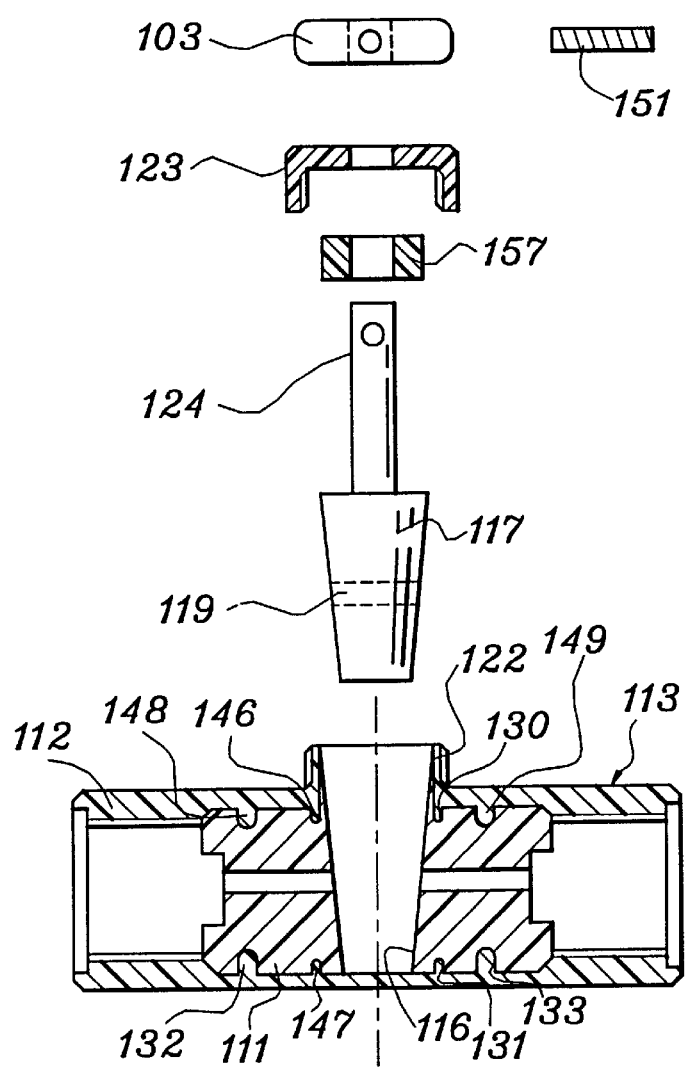
(b)
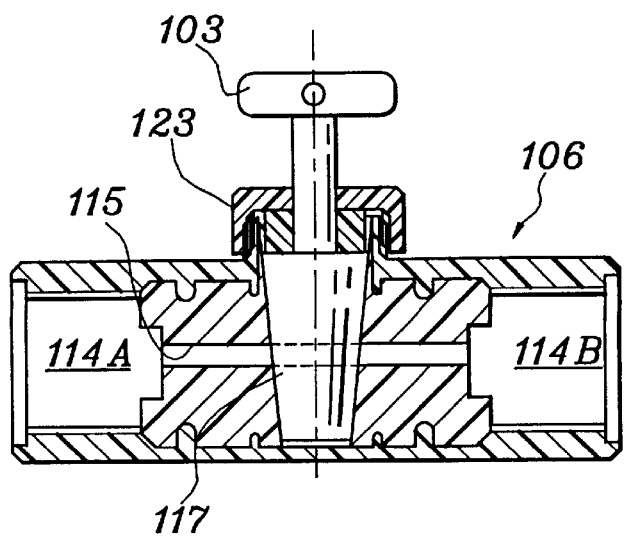

VALVE UNIT HAVING AN INSERT MOLDED INNER VALVE BLOCK

TECHNICAL FIELD

The present invention generally relates to a pick-up tool for releasably holding an article such as a semiconductor wafer by using vacuum suction, and more particularly relates to a valve unit which is suitable for use in such a pick-up tool.

BACKGROUND OF THE INVENTION

Semiconductor devices are most often made by chemically and physically processing silicon wafers, and pick-up tools using vacuum suction are often used for handling the silicon wafers, instead of more conventional pincers. Such pick-up tools are required to be resistant to various chemicals and high temperatures which are used to etch or otherwise process the silicon wafers, and to be free from electrostatic charges because electrostatic charges can damage the silicon wafers. Examples of such pick-up tools are disclosed in Japanese patent publication (kokoku) No. 3-50672, and Japanese patent publication (kokoku) No. 5-75554.

A pick-up tool is equipped with a valve unit for controlling the vacuum suction, and the valve unit also must meet the above-mentioned requirements which are associated with the handling of silicon wafers. The valve unit typically includes a valve main body having a valve seat defined therein, and a valve member which is slidably received in the valve seat so that a passage defined inside the valve main body may be selectively opened and closed as required by turning or otherwise moving the valve member in relation with the valve seat. The valve member must be closely fitted in the valve seat so that a required fluid-tightness may be obtained, and it is essential that the valve main body has a sufficient rigidity not to deform and to maintain the fluid-tightness under substantial external forces. The material for the valve unit must be also capable of withstanding various chemical substances, moisture and temperatures of up to 250° C.

The requirements for the material of the valve unit can thus be summarized as given in the following.

(1) The material should be electroconductive so as to avoid electrostatic charging of the valve unit components which could cause damages to the silicon wafers and lead to deposition of foreign matters.

(2) The material should be resistant to chemical substances which are used for chemically processing and washing the silicon wafers, and should not release any metallic ions when subjected to such chemical substances.

(3) The material should be self-lubricating so that smooth operation may be ensured and emission of particles may be avoided even after long use.

One of the most preferred materials for such valve units as well as such article pick-up tools is fluoride resins such as tetrafluoroethylene. Fluoride resins can meet most of the required properties, but are relatively readily deformable. Therefore, when subjected to significant external forces, a valve unit made of a fluoride resin may not be able to operate smoothly or may lose fluid-tightness. In particular, the screws used for securing a fluoride resin member may become loose in time due to the combined effect of repeated application of fluid pressure and the lack of the mechanical strength of the fluoride resin material. Loosening of the screws, which are typically made of metal or alloy, is also a cause of the rusting of the screws because it increases the chance of exposing the screws to various chemical substances. Additionally, fluoride resins are less immune to electrostatic charging than other resin materials, and the article pick-up tool could become undesirably electrically charged as it is handled by hand.

Fluoride resins such as tetrafluoroethylene are also known to be unsuitable for injection molding and extruding, and are therefore not suited to be molded into complicated shapes.

BRIEF SUMMARY OF THE INVENTION

In view of such problems of the prior art, a primary object of the present invention is to provide a valve unit which is both mechanically and chemically stable.

A second object of the present invention is to provide a valve unit which is suitable for use in extreme environments which arise in the processing of semiconductor wafers.

A third object of the present invention is to provide a valve unit which is economical to manufacture, and reliable in use.

A fourth object of the present invention is to provide a valve unit which is suitable for use in a pick-up tool for handing semiconductor wafers.

According to the present invention, these and other objects are accomplished by providing a valve unit, comprising: a valve main body having a communication passage, and a valve seat defined in an intermediate part of the communication passage; a valve member received in the valve seat for selective communication of the communication passage; and a valve case which is injection molded around the valve main body; the valve member being provided with a valve stem extending out of the valve main body and the valve case.

Thus, the valve main body may be made of a material suitable for the operation of the valve member while the valve case may be made of a material suitable for ensuring a required mechanical strength of the valve unit. For instance, the valve main body may be made of a resin material having a self-lubricating property, and the valve case may be made of a resin material which is resistant to deformation. Also, the valve case may be made of a material suited to be molded into a desired complicated shape. This is particularly advantageous when the valve case is provided with a passage communicating with the communication passage of the valve main body for external communication.

In applications where the electrostatic charging of the valve body may become a problem, for instance in semiconductor wafer pick-up tools, the valve case may be made of a relatively electroconductive resin material. According to a preferred embodiment for such an application, the valve case is made of polyether-etherketone resin material mixed with carbon fibers while the valve main body is made of tetrafluoroethylene resin material.

Because the injection molding process can achieve a highly close attachment between the valve main body and the valve case, the leakage of fluid can be avoided. If the valve main body is provided with a plurality of grooves or projections for restraining relative deformation between the main body and the valve case, an even closer attachment between the two parts can be achieve. In particular, the valve main body can be favorably reinforced by the valve case so that the valve seat defined in the valve main body can be maintained even under significant external forces, and the satisfactory operation of the valve unit can be ensured at all times.

According to a preferred embodiment of the present invention which is suited to be installed in semiconductor wafer pick-up tools, the valve main body comprises a cylindrical member, the communication passage consisting of a longitudinal passage passed longitudinally through the cylindrical member, the valve seat being defined by a valve guide hole passed laterally across the cylindrical member. Typically, the valve member is slidably or rotatably received in the valve guide hole, and a valve stem extends out of the valve case coaxially with the valve guide hole. To achieve a close contact between the valve case and the valve main body, and to favorably reinforce the valve main body against deformation, an annular groove may be defined in a surface part of the valve main body surrounding the valve guide hole, and a pair of annular grooves may be formed circumferentially around the valve main body on either axial side of the valve guide hole.

According to a particularly preferred embodiment of the present invention, the valve member is slidably received in the valve guide hole, and a compression coil spring is interposed between a bottom end of the valve member and a bottom of the valve guide hole, the valve member being provided with an annular groove for selectively communicating with the communication passage. Furthermore, the valve case may be provided with an upstream passage communicating with one end the communication passage and a downstream passage communicating with the other end of the communication passage, the bottom end of the valve guide hole being provided with a vent hole for communication with the exterior, the valve main body being provided with a bypass passage extending between the valve guide hole and one of the upstream passage and the downstream passage of the valve case so as to be closed by the valve member when the valve member is opening the communication passage, and to be in communication with the vent hole when the valve member is closing the communication passage. In the case of a normally open valve unit, the vent hole should be provided in an upper end of the valve guide hole.

The valve stem must be sealed while allowing the required movement of the valve member for the operation of the valve unit. To achieve this goal both reliably and economically, the valve case may be provided with an annular boss surrounding the valve stem, and a cap may be fitted on the annular boss for retaining the valve member inside the valve seat, the valve stem being passed through the cap. Alternatively, the valve case may be provided with an annular boss surrounding the valve stem, and a plug may be fitted into the annular boss for retaining the valve member inside the valve seat, the valve stem being passed through the plug.

BRIEF DESCRIPTION OF THE DRAWINGS

Now the present invention is described in the following with reference to the appended drawings, in which:

FIGS. 1(a) and 1(b) are side and front views of a semiconductor wafer pick-up tool to which the present invention is applied;

FIGS. 2(a) and 2(b) are perspective views of the suction adapter showing the front and reverse sides thereof, respectively;

FIG. 3(a) is a front view of the suction adapter;

FIGS. 3(b), 3(d) and 3(c) are sectional views taken along lines A–B, C–D and E–F, respectively;

FIGS. 6(a) and (b) are a perspective view and a sectional view of the valve block used for forming the valve main body respectively;

FIGS. 9(a) and 9(b) are fragmentary sectional views showing parts of FIG. 8 indicated by V and H, respectively;

FIGS. 11(a) and 11(b) are sectional views of a second embodiment of the valve unit according to the present invention during and after the assembling process, respectively;

FIGS. 13(a) and 13(b) are sectional views of a fourth embodiment of the valve unit according to the present invention during and after the assembling process, respectively.

DETAILED DESCRIPTION OF THE PREFERRED EMBODIMENTS

Figure 4:
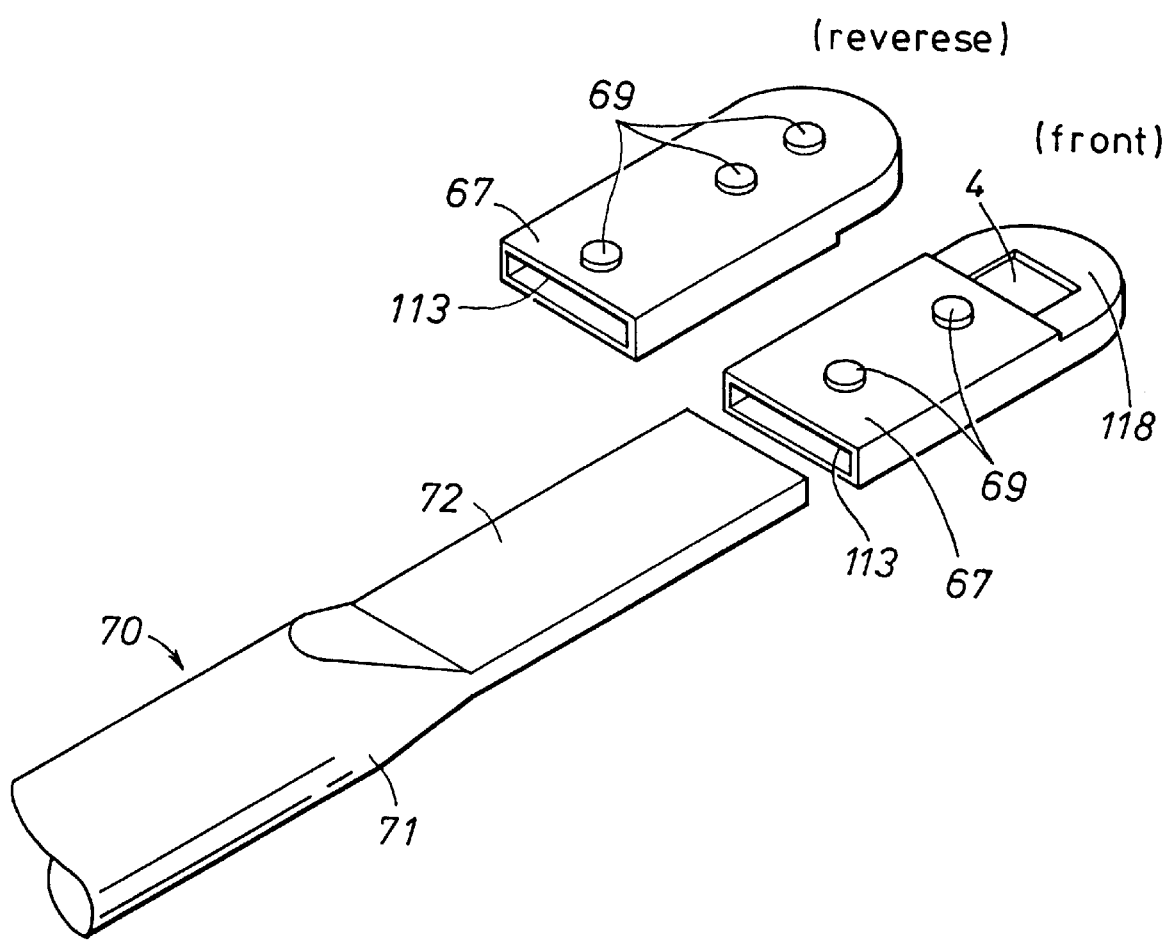
FIG. 4 is a perspective view showing the core pin and the tubular insert used for molding the suction adapter.

FIGS. 1(a) and 1(b) show a wafer pick-up tool 1 to which the present invention is applied. The pick-up tool 1 is generally elongated in shape, and comprises a valve unit 6 which is provided with an operation knob 3, an extension tube 8 connected to the rear end of the valve unit 6 and having an internal bore 7 defined therein, and a connector 10 attached to the rear end of the extension tube 8. The connector 10 can be releasably connected to a corresponding connector 81 of a hose 82 which leads to a vacuum source not shown in the drawing. The pick-up tool 1 further comprises a suction adapter 2 which is detachably connected to the front end of the valve unit 6 via a connector 9.

Referring to FIGS. 2(a) and 2(b), the suction adapter 2 comprises a connecting tube 61 adapted to be connected to the front end of the valve unit 6 via the connector 9 and provided with a circular cross section, a conduit section 62 formed in the front end portion of the connecting tube 61 and provided with an elliptic cross section, and a planar suction tip 64 formed in the front end portion of the conduit section 62. The suction tip 64 is provided with a suction plate 68 (FIG. 3(a)) which defines a peripheral suction surface, and provided with a comb-shaped recess 5 recessed from the suction surface, and a suction hole 4 which communicates the recess 5 with an inner bore 66 passed through the connecting tube 61 and the conduit section 62.

Referring to FIGS. 3(a) to 3(d), a tubular insert 67 (FIG. 3(c)) is insert molded from a front end portion of the conduit section 62 to a base end portion of the suction tip 64. Using the tubular insert 67 substantially reduces the difficulty in forming the internal passage extending from the internal bore 66 of the conduit section 62 to the suction hole 4. This is particularly advantageous because the material suitable for the suction tip 64 such as polyimide resin involves some difficulty in being injection molded into a complicated shape, and because the structure of the die assembly can be simplified. A particularly suitable material for the suction tip 64 is totally aromatic polyimide resin such as Vespel (tradename) commercially available from DuPont. Polybenzimidazole resin is also suitable as a material for the suction tip 64. The remaining part of the suction adapter 2 as well as the tubular insert 67 may be made of more economical and more injection moldable materials such as PEEK (polyether-etherketon) which is preferably mixed with carbon fibers by approximately 15% so as to increase the electroconductivity as well as the mechanical strength of the material.

FIG. 4 shows the tubular insert 67 as well as a molding core 70 having two sections 71 and 72 for defining the different sections of the internal bore 66 (FIG. (3(b)) of the connecting tube 61 and the conduit section 62 (FIG. 3(a)), respectively. The tubular insert 67 is preferably made of the same or a similar material as the conduit section 62 so that these two members may be integrally joined together by the insert molding process consisting of an injection molding process. The tubular insert 67 is provided with a plurality of projections 69 so that the tubular insert 67 may be securely attached to the suction tip 64 and the conduit section 62 after the insert molding process.

Figure 5:
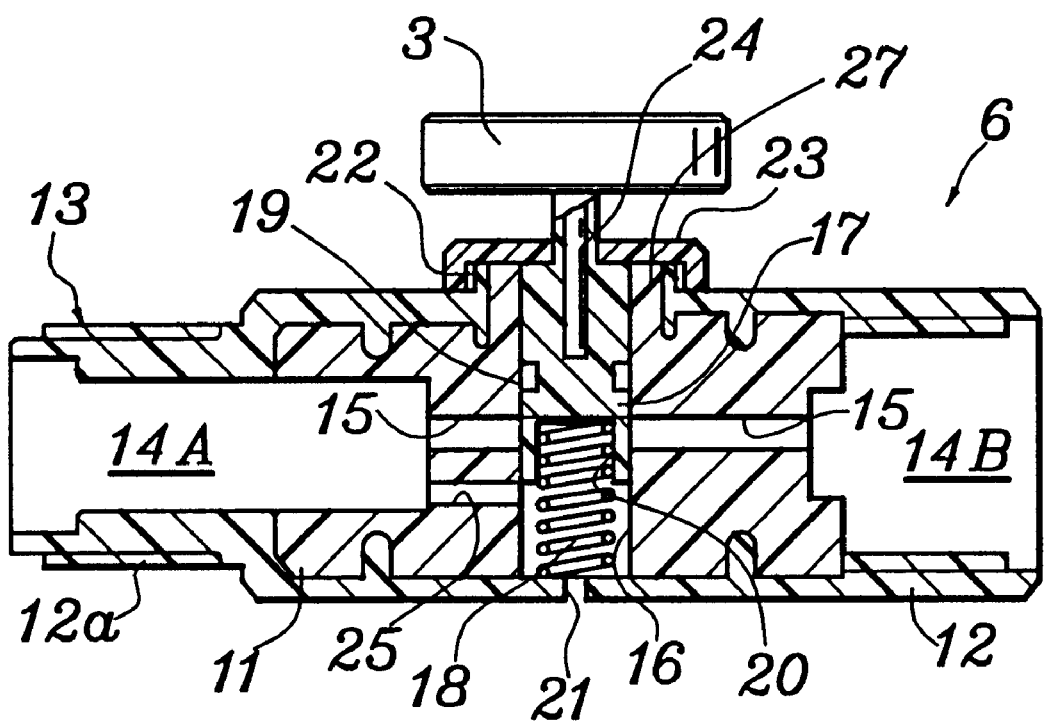
FIG. 5 is a sectional view showing a first embodiment of the valve unit according to the present invention.

Referring to FIG. 5, the valve unit 6 is provided with a valve housing 13 consisting of a valve main body 11 and a cylindrical valve case 12 which surrounds the valve main body 11. The internal bore of the valve case 12 is blocked by the valve main body 11 which consists of a substantially solid block member, and thus defines an upstream passage 14A and a downstream passage 14B on either longitudinal end of the valve main body 11. The valve main body 11 is provided with a longitudinal passage 15 passed completely and centrally through the valve main body 11, and a valve guide hole 16 is passed laterally and centrally across the valve main body 11. The longitudinal passage 15 and the valve guide hole 16 therefore cross each other at a right angle. A bypass passage 25 is provided below the longitudinal passage 15, and extends between the upstream passage 14A and the valve guide hole 16.

The valve guide hole 16 receives therein a valve member 17 which is urged upward as seen in FIG. 5 by a compression coil spring 18. The valve member 17 is generally cylindrical in shape, and is provided with a recess 20 at its bottom end for receiving an end of the compression coil spring 18, and is provided with an annular groove 19 around its circumference. The other end or the lower end of the compression coil spring 18 abuts the wall of the valve case 12 which is provided with a vent hole 21 communicating the valve chamber defined by the bottom end of the valve member 17 and the valve guide hole 16 with the atmosphere. The upper end of the valve guide hole 16 is integrally provided with an annular boss 27 which extends out of the valve case 12, and is closed by a cap 23 threadably engaged with an annular boss 22 which is integrally formed with the valve case 12 and closely surrounds the annular boss 27 of the valve main body 11. The cap 23 thus restrains the upward movement of the valve member 17. A valve rod 24 is securely attached to the upper end of the valve member 17, and is passed through the cap 23. The outer end of the valve rod 34 is attached to the knob 3.

The valve unit 6 may be either a normally open type which normally opens the longitudinal passage 15 and communicates the vacuum suction to the suction adapter 2, or a normally closed type which normally closes the longitudinal passage 15 and interrupts communication of the vacuum suction to the suction adapter. The valve unit 6 illustrated in FIG. 5 is a normally closed type, and the upstream passage 14A and the downstream passage 14B are normally discommunicated from each other by the valve member 17 closing the longitudinal passage 15.

Initially, the longitudinal passage 15 is closed by the valve member 17, and the upstream passage 14A is communication with the atmosphere via the bypass passage 25, and the vent hole 21. The downstream passage 14B is communicated only with the vacuum source not shown in the drawings. When the knob 3 is pressed downward against the biasing force of the compression coil spring 18 to push down the valve member 17, the longitudinal passage 15 is now communicated by the annular groove 19 while the bypass passage 18 is closed by the valve member 17. Therefore, the vacuum suction is transmitted from the downstream passage 14B to the upstream passage 14A.

When the knob 3 is released, the valve member 17 moves upward to the position illustrated in FIG. 5 under the spring force of the compression coil spring 18. As a result, the initial state is restored. In other words, the longitudinal passage 15 is now closed by the valve member 17 while the bypass passage 25 is communicated with the atmosphere via the vent hole 21. Therefore, the vacuum suction would not reach the upstream passage 14A, and any vacuum suction that may be remaining in the upstream passage 14A is relieved by the communication with the atmosphere via the bypass passage 25 and the vent hole 21.

Figure 7:
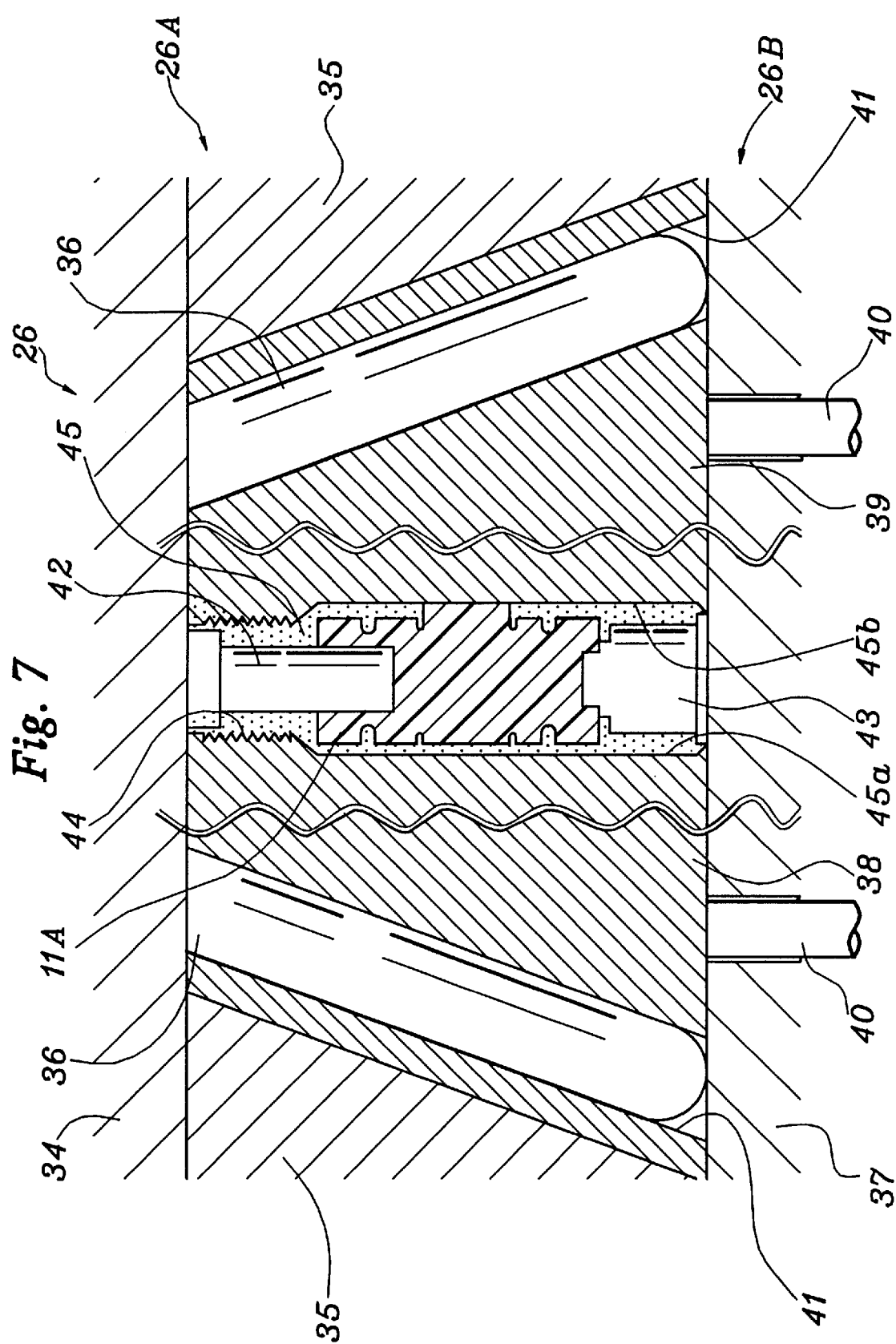
FIG. 7 is a sectional view of an essential part of the molding die assembly for injection molding the valve case over the valve main body.
Figure 10:
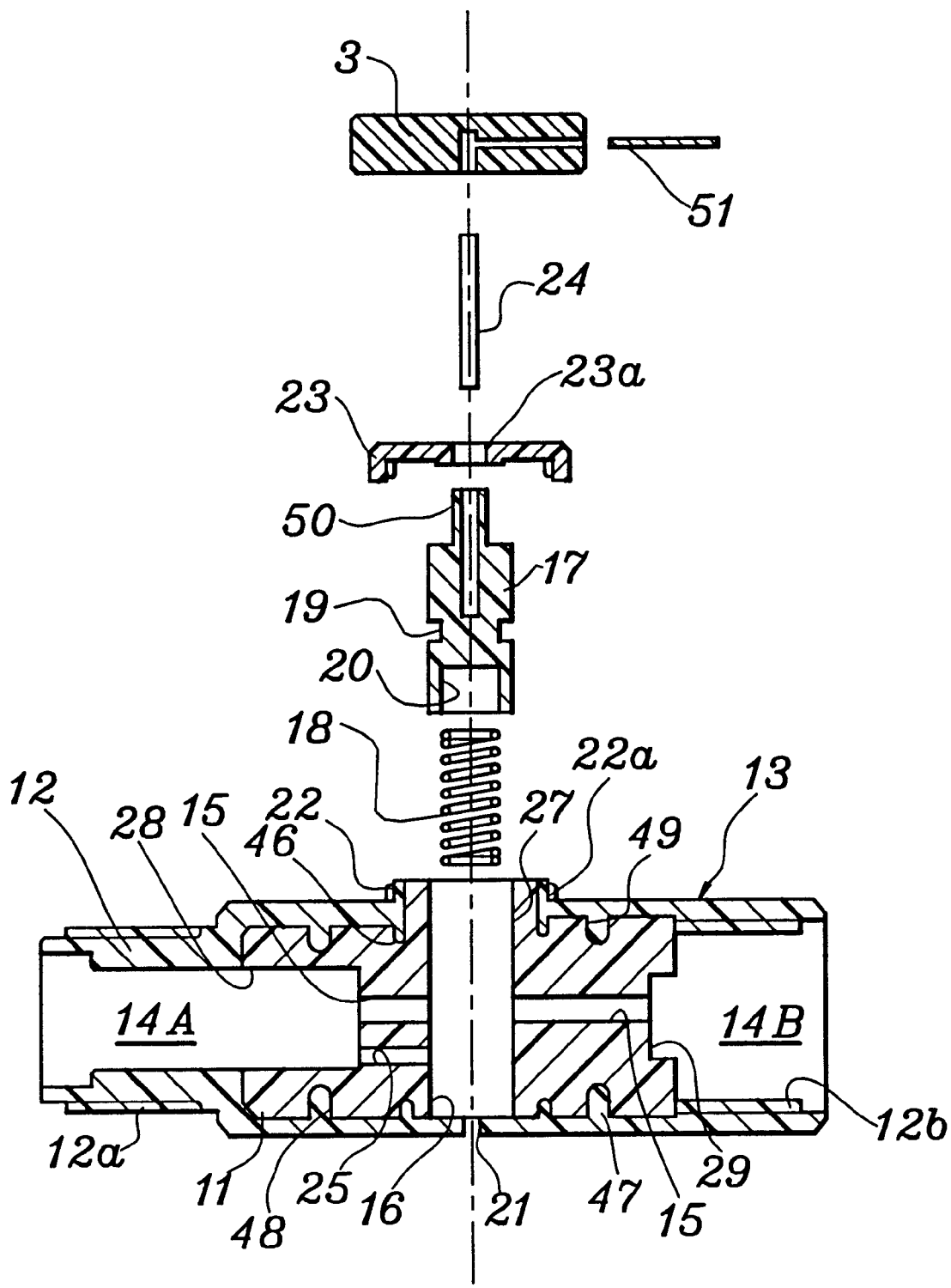
FIG. 10 is an exploded sectional view of the valve unit of the first embodiment.

The process of manufacturing valve unit 6 is described in the following with reference to FIGS. 6(a), 6(b) and 7. Initially, a valve block 11A for forming the valve main body 11 is prepared, and is formed the shape illustrated in FIGS. 6(a) and 6(b). This valve block 11A is fitted into a die cavity 45 of a die assembly 26 of an injection molding machine as illustrated in FIG. 7, and the valve case 12 is injection molded around the valve block 11A. Some additional and optional machining, such as drilling the valve guide hole 16, the longitudinal hole 15 and the bypass passage 25, is conducted on the thus prepared valve housing 13, and the valve member 17 and other components are assembled to the valve housing 13 as illustrated in FIG. 10.

The valve block 11A is typically made of heat resistant, corrosion resistant and self-lubricating synthetic resin material such as fluoride resin. In the present embodiment, tetrafluoroethylene (PTFE) is used for the valve block 11A. The material for the valve case 12 is desired to have a suitable electroconductivity to avoid electrostatic charging as well as being heat resistant and corrosion resistant. In the present embodiment, PEEK containing approximately 15% of carbon fibers is used to form the valve case 12. PEEK reinforced by carbon fibers is particularly preferred as it is highly heat resistant and has a high mechanical strength combined with a relatively high electroconductivity.

The block 11A consists of an axially elongated block having a rectangular cross section as illustrated in FIGS. 6(a) and (b), and is provided with a circular projection 27A which is surrounded by an annular groove 30. A similar annular groove 31 is provided on the bottom side of the block 11A. The two axial ends of the block 11A are provided with circular recesses 28 and 29, and a pair of annular grooves 32 and 33 are formed circumferentially around the block 11A.

FIG. 7 illustrates a part of the molding die assembly 26 for molding the valve case 12 which comprises a fixed die section 26A and a moveable die section 26B. The fixed die section 26A is provided with an ejector plate 34, a fixed die plate 35 and angular pins 36 while the moveable die section 26B comprises a moveable die plate 37, a pair of split die blocks 38 and 39, and . ejector pins 40. The split die blocks 38 and 39 are provided with guide holes 41 for receiving the angular pins 36 when closing the die assembly 26.

Additionally, the fixed die section 26A is provided with a fixed end support pin 42 projecting vertically downward from the ejector plate 34, and the moveable die section 26B is similarly provided with a moveable end support pin 43 projection vertically upward from the fixed die plate 37. These support pins 42 and 43 oppose each other along the central axial line of the die cavity 45 inside the die cavity 45, and the die cavity 45 is defined by threaded sections 44 and recesses 45a and 45b.

According to this molding die assembly 26, the block 11A is held in the die cavity 45 by fitting the support pins 42 and 43 into the corresponding circular recesses 28 and 29 provided in the axial ends of the block 11A, and as the split die blocks 38 and 39 are pushed into the fixed die plate 35 of the fixed die section 26A by the ejector pins 40 projecting from the split die blocks 38 and 39, the die cavity 45 is closed by the split die blocks 38 and 39 guided by the angular pins 36 passed through the guide holes 41. As a result, the valve block 11A is completely enclosed inside the cavity 45.

The fixed and moveable die sections 26A and 26B are heated in advance, and polyether-etherketone (PEEK) mixed with carbon fibers and heated to a prescribed temperature is filled into the die cavity 45 from a gate via a spruce runner and a runner. The injected resin material is thus molded into the valve case 12 which closely surrounds the valve block 11A. At the same time, the outer thread 12a is formed by a thread surface formed on the wall surface of the die cavity 45, and the upper surface of the circular extension 27 is exposed out from a side of the valve case 12. The injected resin also fills into the annular grooves 30 and 31, and the circumferential grooves 32 and 33, and forms ribs, complementary to these grooves, which reinforce the valve case 12 on the one hand, and increase the force of attachment between the valve case 12 and the valve block 11A. The support pins 42 and 43 similarly form the upstream and downstream passages 14A and 14B of the valve housing 13.

In this embodiment, the die assembly was heated to the temperature of approximately 180° C., and polyetheretherketone (PEEK) which was mixed with carbon fibers and heated to the temperature of approximately 380° C. was filled into the cavity 45. The injected resin material is attached around the valve block 11A which is made of tetrafluoroethylene (PTFE) and held inside the cavity 45, and the thus prepared valve housing 13 incorporates the valve block 11, serving as an insert member, integrally with the valve case 12.

Because the valve case 12 is injection molded over the valve block 11A made of a fluoride resin which is somewhat thermally expanded immediately after the molding process, as soon as the injection molding process is completed, the valve case 12 starts thermally shrinking. Therefore, when the molded assembly is removed from the cavity and placed in an ambient temperature, a gap would be produced between the valve block 11A and the valve case 12 because of the difference in the thermal expansion coefficients of these two parts, but owing to the engagement between the ribs and the annular grooves 30 to 33, the valve block 11A and the valve case 12 remain securely attached to each other. Also, it is possible to eliminate any gaps which would reduce the air-tightness of the valve unit. Such a reduction in air-tightness could cause the loss of the force that is available in securing the article at the suction adapter, and is therefore detrimental to the satisfactory operation of the pick-up tool.

During the injection molding process for the valve housing 13, the valve block 11A placed inside the die cavity 45 of the molding die assembly 26 initially expands thermally owing to the heat supplied from the die assembly 26, and expands further owing to the heat supplied by the hot molten resin material injected into the die cavity 45. Such an expansion of the valve block 11A is opposed by the pressure of the injected resin material, and if necessary, the temperature condition may be selected such that the surface of the valve block 11A is slightly melted, and that the outer profile of the valve block 11A is made somewhat reduced from the initial conduction by the pressure applied to it. In any case, it is essential to properly select the pressure at which the molten resin is injected into the cavity. If the pressure is excessive, upon removal of the molded assembly, the valve block 11A which is released from the pressure may apply an excessive internal pressure to the valve case 12, and could damage the valve case 12. If the injection pressure is insufficient, some gaps may be formed in the interface between the two parts, and a desired air-tightness may not be obtained.

Upon removing the valve housing after completion of the injection molding process, the valve case 12 is immediately exposed to the ambient air and shrinks to its prescribed size in a relatively short time period. However, the valve block 11A would not immediately shrink even when the surface has been cooled to the ambient temperature because of the heat trapped inside the valve block 11A. Therefore, there are some differences in the history of contraction between the valve block and the valve case after removal form the die cavity, but owing to the resilience of the valve case 12, the two parts eventually become closely attached to each other substantially without any gap between them. Because the valve case 12 tends to shrink from its molded size as it cools, it is desirable to define the cavity slightly larger than the final intended size of the valve housing 13.

Figure 8:
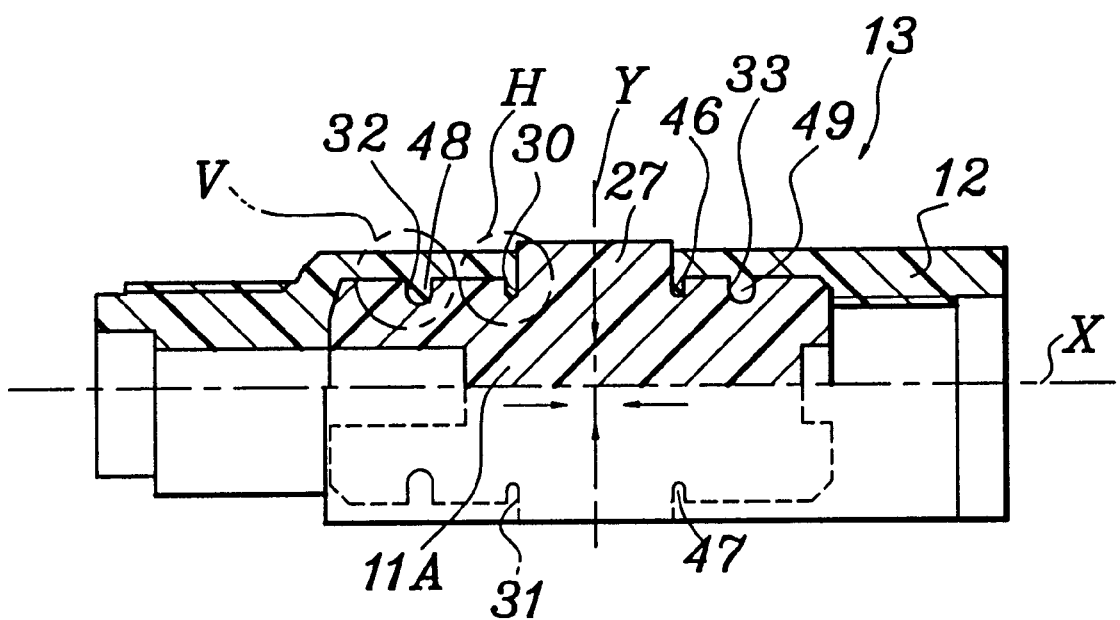
FIG. 8 is a sectional view of the valve housing immediately after being taken out of the die cavity.

Referring to FIG. 8, the shrinking of the valve block 11A occurs inwardly both longitudinally (X-axis) and radially (Y-axis). Although this shrinking is extremely minor, it still could affect the operation of the valve unit when controlling the flow of high pressure fluid. Were it not for the annular grooves 30 to 33, there would be a high tendency for a relative displacement between the inner surfaces of the valve case 12 which is made of a material having a relatively large thermal expansion coefficient, and the outer surfaces of the valve block 11A, and gaps would be created between them. Such gaps can cause leakage of fluid out of the valve chamber. The annular grooves are not essential for the present invention, but are highly beneficial in controlling leakage in the valve unit.

It is also essential that the guide hole 16 maintains its shape for satisfactory operation of the valve because the valve main body 11 is made by drilling the guide hole 16 from the end surface of the circular projection, and the inner surface of this guide hole 16 serves as a valve seat which cooperates with the valve member 17 which is slidably received in the guide hole 16. To this end, not only the valve main body 11 must be sufficiently resistant to deformation but also the valve case 12 should protect the valve body 11 from external forces.

When the valve main body 11 is made of a synthetic resin material which has a high thermal coefficient and is relatively deformable, the valve main body 11 may expand or contract according to the changes in the ambient temperature. The valve case 11 may also deform when the valve case 12 is firmly held by a hand to operate the knob 3, and the valve case 12 is itself readily deformable. From such considerations, the valve case should be free from shrinking which could apply pressure upon the valve body 11, and the valve case 12 is also desired to be resistant to deformation so that it prevents any external force applied thereto from being transmitted to the valve body 11.

However, when the valve block 11A is provided with the circumferential grooves 32 and 33, and the valve case 12 is provided with the corresponding circumferential ribs 48 and 49 as illustrated in FIG. 8, an axial contraction of the valve block 11A is opposed by the engagement between the circumferential grooves 32 and 33 and the circumferential ribs 48 and 49. FIG. 9(a) shows the axial contraction of circumferential rib 48 against circumferential groove 32. When there is any relative axial contraction between the valve block 11A and the valve case 12, the circumferential grooves 32 and 33 are pushed firmly against the circumferential ribs 48 and 49 as indicated by numeral 54 so that the gap 52 which may develop between the valve block 11A and the valve case 12 is closed by this circumferential contact region 54, and the required air tightness of the valve housing 13 can be ensured. The sealing effect afforded by this circumferential contact region 54 is maintained even when the valve block 11A laterally contracts relative to the valve case 12 as indicated by the arrow B.

Moreover, when the valve block 11A is provided with the annular grooves 30 and 31, and the valve case 12 is provided with the corresponding annular ribs 46 and 47 as illustrated in FIGS. 8, an axial contraction of the valve block 11A is opposed by the engagement between the annular grooves 30 and 31 and the annular ribs 46 and 47. FIG. 9(b) shows the axial contraction of annular rib 46 against annular groove 30. When there is any relative axial contraction between the valve block 11A and the valve case 12, the annular grooves 30 and 31 are pushed firmly against the annular ribs 46 and 47 as indicated by numeral 55 so that the gap 52 which may develop between the valve block 11A and the valve case 12 is closed by this annular contact region 55, and the required air tightness of the valve housing 13 can be ensured. The sealing effect afforded by this annular contact region 55 is maintained even when the valve block 11A laterally contracts relative to the valve case 12 as indicated by the arrow D.

Furthermore, this contact region 55 attaches the part of the valve case 12 surrounding the circular projection 27 to the same, thereby reinforcing the circular projection 27 against a radial deformation, and preventing the deformation of the valve guide hole 16 that will be drilled in the projection 27.

Referring to FIG. 10, valve housing assembly 13 is taken out of the molding die assembly 26, and is suitable drilled and machined. More specifically, the valve guide hole 16 is drilled centrally from the outer end surface of the circular projection 27, and a thread 22a is formed around the outer end of the circular projection 27 to form the annular boss 22. The vent hole 21 is drilled in the valve case 12 to communicate the bottom end of the valve guide hole 16 with the atmosphere.

The longitudinal hole 15 is drilled axially through the valve case 11 between the upstream passage 14A and the downstream passage 14B, and the bypass passage is drilled between the upstream passage 14A and the valve guide hole 16. An inner thread 12b is formed in the inner wall of the outer end of the downstream passage 14B, and the outer thread 12a on the outer circumference of the upstream end of the valve case 12 is finished to a required precision.

Then, a compression coil spring 18 and the valve member 17 are fitted into the valve guide hole 16, in that order and with the recessed end of the valve member 17 first, from the upper end of the annular boss 22, and the cap 23 is threadingly fitted over the annular boss 22. The upper stem end 50 of the valve member 17 projects out of the cap 23 is attached to the knob 3 with a valve shaft 24 which is press fitted into the valve member 17 and secured to the knob 3 by a set screw 51.

FIGS. 11(a) and 11(b) show an alternate arrangement. In these drawings, the parts corresponding to those of the previous embodiment are denoted with like numerals. The valve case 13 is provided with an annular boss 56 having an internal thread 56a while the valve main body 11 is not provided with the circular projection 17. A flanged bush 57 is placed inside the annular boss 56, and is secured therein by a tubular plug 58 provided with an outer thread 58a which is engaged with the outer thread 56a. A cap 59 may be optionally fitted over the annular boss 56.

Figure 12:
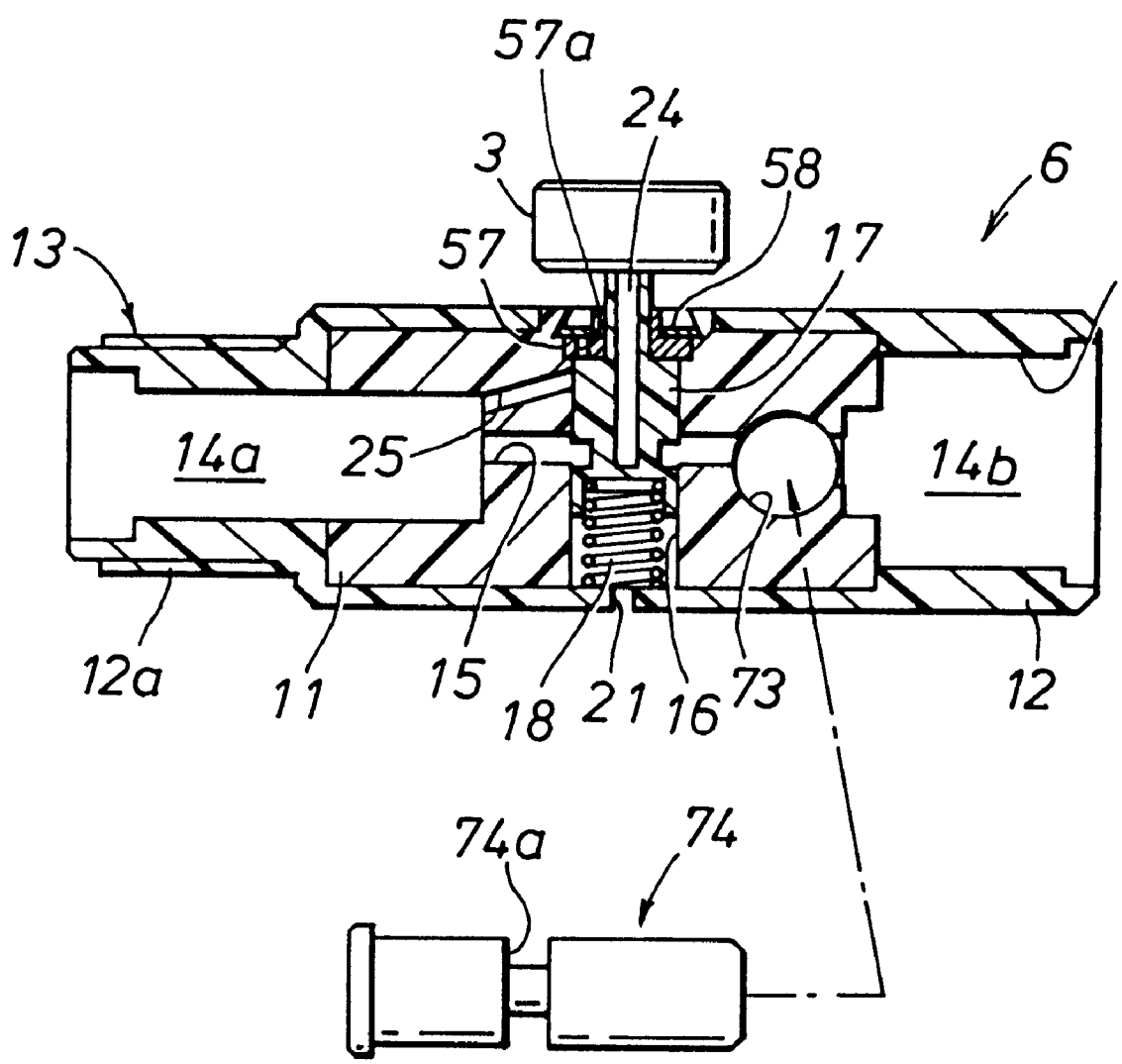
FIG. 12 is a view similar to FIG. 5 showing a third embodiment of the present invention constructed as a normally open type valve unit.

FIG. 12 shows a normally open type valve unit, and, in this drawing, the parts corresponding to those of the previous embodiments are denoted with like numerals. This embodiment is similar to the valve unit illustrated in FIG. 5, but the bypass passage 25' extends from the upstream passage 14A to a part of the valve guide hole 16 adjacent the valve stem end of the valve guide hole 16. The valve member 17 is retained in the valve guide hole 16 by a collar 57 and a C-ring 58. The collar 57 is provided with a vent hole 57A for communicating the chamber defined between the upper end of the valve member 17 and the collar 57 to the atmosphere. A lateral hole 73 is passed through a downstream end of the longitudinal passage 15, and a shut-off valve member 74 is slidably but closely fitted in this lateral hole 73. The two ends of the shut-off valve member 74 extend out of the valve housing so that an annular groove 74A formed in an intermediate part of the shut-off valve member 74 may move and in and out of the longitudinal passage 15.

Therefore, according to this embodiment, when the knob 3 is not operated, the longitudinal passage 15 is communicated, however, provided that the annular groove 74A is placed in longitudinal passage 15. By pushing down the knob 3, the longitudinal passage 15 is closed by the valve member 17, and the upstream passage 14A is communicated with the atmosphere via the bypass passage 25' and the vent hole 57A so that any negative pressure that may be remaining in the upstream passage 14A can be removed. When the valve unit is not being used, and the suction is not required to be transmitted to the upstream passage 14A, the shut-off valve member 74 may be pushed in either direction so that the longitudinal passage 15 can be closed without operating the knob 3.

In this embodiment, the outer surface of the valve main body 11 is not provided with any grooves for more closely securing the valve main body 11 and the valve case 12 together. If desired, the grooves similar to the grooves 30 to 33 of the previous embodiments, or, alternatively, annular projections can be formed in the valve main body 11 so that corresponding annular projections or grooves, as the case may be, may be formed in the inner surface of the valve case 12.

In the above described embodiments, the valve member 17 was moved axially inside a valve seat defined by the valve guide hole 16, but other known arrangements of valves can be applied to the present invention. FIGS. 13(a) and 13(b) show an embodiment of the present invention applied to a cock valve having a frusto-conical valve member which is received in a complementary valve seat, and is adapted to be turned around its axial center line.

Referring to FIGS. 13(a) and 13(b), according to this embodiment, similarly to the previous embodiments, a valve housing 113 is formed by injection molding a valve case 112 around an insert member serving as a valve main body 111. The valve main body 111 is provided with annular grooves 130 to 133, similar to the annular grooves 30 to 33 of the previous embodiments, which cause corresponding annular projections 146 to 149 inside the valve case 112.

A longitudinal passage 115 is passed axially through the valve main body 111 so as to communicate an upstream passage 114A with a downstream passage 114B. A frusto-conical valve guide hole 116 is formed laterally across the valve main body 111, and rotatably receives the complementary valve member 117 which is provided with a lateral through hole 119. The valve member 117 is provided with a valve stem 124 extending out of the valve case 112, and the valve member 117 is retained in the valve guide hole 116 by a collar 157 and a cap 123, with the cap threadably engaged to an annular boss forced in the valve case 112 around the valve guide hole 116 and the collar 157 interposed between the upper end of the valve member 117 and the inner surface of the cap 123. The outer end of the valve stem 124 is fitted with a knob 103 which is secured thereto by a set screw 151. By turning the valve member 117 around its axial center, the lateral through hole 119 can be selectively aligned with the longitudinal passage 115, and the upstream passage 114A can be thereby selectively communicated with the downstream passage 114B.

Although the present invention has been described in terms of specific embodiments thereof, it is possible to modify and alter details thereof without departing from the spirit of the present invention.

What we claim is:

1. A valve unit, comprising:
    a valve main body having a communication passage, and a valve seat defined in an intermediate part of said communication passage, the valve main body being made from a resin material and the valve seat being an integral part of said valve main body, wherein said valve main body comprises a cylindrical member, said communication passage consisting of a longitudinal passage passed longitudinally through said cylindrical member, said valve seat being defined by an elongated valve guide hole passed laterally across said cylindrical member and said longitudinal passage, and wherein said valve main body is provided with a plurality of grooves or projections for restraining relative deformation between said main body and said valve case;
    a valve member received in said valve seat for selectively blocking said communication passage; and
    a valve case disposed around said valve main body, the valve case being sealed to the valve main body by an injection molded seal of the valve case to the valve main body;
    said valve member being provided with a valve stem extending out of said valve main body and said valve case.

2. A valve unit according to claim 1, wherein said valve case is provided with a passage communicating with said communication passage of said valve main body for communication to atmosphere external to the valve unit.

3. A valve unit according to claim 1, wherein the resin material of the valve main body has a self-lubricating property, and said valve case is made of a resin material which is resistant to deformation.

4. A valve unit according to claim 1, wherein said valve member is slidably or rotatably received in said valve guide hole, and a valve stem extends out of said valve case coaxially with said valve guide hole, an annular groove being defined in a surface part of said valve main body surrounding said valve guide hole.

5. A valve unit according to claim 1, wherein a pair of annular grooves are formed circumferentially around said valve main body on either axial side of said valve guide hole.

6. A valve unit according to claim 1, wherein said valve member is slidably received in said valve guide hole, and a compression coil spring is interposed between a bottom end of said valve member and a bottom of said valve guide hole, said valve member being provided with an annular groove for selectively communicating said communication passage.

7. A valve unit according to claim 6, wherein said valve case is provided with an upstream passage communicating with one end of said communication passage and a downstream passage communicating with another end of said communication passage, said bottom end of said valve guide hole being provided with a vent hole for communication to atmosphere exterior to the valve unit, said valve main body being provided with a bypass passage extending between said valve guide hole and said upstream passage of said valve case so as to be closed by said valve member when said valve member is opening said communication passage, and to be communicated with said vent hole when said valve member is closing said communication passage.

8. A valve unit according to claim 6, wherein said valve case is provided with an annular boss surrounding said valve stem, and a cap is fitted on said annular boss for retaining said valve member inside said valve seat, said valve stem being passed through said cap.

9. A valve unit according to claim 6, wherein said valve case is provided with an annular boss surrounding said valve stem, and a plug is fitted into said annular boss for retaining said valve member inside said valve seat, said valve stem being passed through said plug.

10. A valve unit according to claim 6, wherein said valve case is provided with an upstream passage communicating with one end of said communication passage and a downstream passage communicating with another end of said communication passage, an upper end of said valve guide hole being provided with a vent hole for communication to atmosphere exterior to the valve unit, said valve main body being provided with a bypass passage extending between said valve guide hole and said upstream passage of said valve case so as to be closed by said valve member when said valve member is opening said communication passage, and to be communicated with said vent hole when said valve member is closing said communication passage.

11. A valve unit according to claim 1, wherein said valve case is made of a relatively electroconductive resin material.

12. A valve unit according to claim 11, wherein said valve case is made of polyether-etherketone resin material mixed with carbon fibers while said valve main body is made of tetrafluoroethylene resin material.

13. A valve unit according to claim 1, wherein said elongated valve guide hole is a cylindrical valve guide hole.

14. A valve unit according to claim 1, wherein said elongated valve guide hole is a frusto-conical valve guide hole.

15. A valve unit, comprising:
    a valve main body having a communication passage, and a valve seat defined in an intermediate part of said communication passage, the valve main body being made from a resin material and the valve seat being an integral part of said valve main body;
    a valve member received in said valve seat for selectively blocking said communication passage; and a valve case disposed around said valve main body, the valve case being sealed to the valve main body by an injection molded seal of the valve case to the valve main body;

wherein said valve member being provided with a valve stem extending out of said valve main body and said valve case; and said valve main body is provided with a plurality of grooves or projections for restraining relative deformation between said main body and said valve case.

16. The valve unit of claim 15, wherein said valve case is provided with a passage communicating with said communication passage of said valve main body for communication to atmosphere external to the valve unit.

17. The valve unit of claim 15, wherein said valve main body comprises a cylindrical member and wherein said communication passage consisting of a longitudinal passage passed longitudinally through said cylindrical member, said valve seat being defined by an elongated valve guide hole passed laterally across said cylindrical member and said longitudinal passage.

18. The valve unit of claim 17, wherein said elongated valve guide hole is a cylindrical valve guide hole.

19. The valve unit of claim 17, wherein said elongated valve guide hole is a frusto-conical valve guide hole.

20. The valve unit of claim 15, wherein said valve member is slidably received in said valve guide hole, and a compression coil spring is interposed between a bottom end of said valve member and a bottom of said valve guide hole, said valve member being provided with an annular groove for selectively communicating said communication passage.

21. The valve unit of claim 20, wherein said valve case is provided with an upstream passage communicating with one end of said communication passage and a downstream passage communicating with another end of said communication passage, said bottom end of said valve guide hole being provided with a vent hole for communication to atmosphere exterior to the valve unit, said valve main body being provided with a bypass passage extending between said valve guide hole and said upstream passage of said valve case so as to be closed by said valve member when said valve member is opening said communication passage, and to be communicated with said vent hold when said valve member is closing said communication passage.

22. The valve unit according to claim 15, wherein said valve case is made of a relatively electroconductive resin material.

23. The valve unit according to claim 22, wherein the valve case is made of polyether-etherketone resin material mixed with carbon fibers while said valve main body is made of tetrafluoroethylene resin material.

* * * * *

UNITED STATES PATENT AND TRADEMARK OFFICE
CERTIFICATE OF CORRECTION

PATENT NO.     : 6,176,265 B1
DATED          : January 23, 2001
INVENTOR(S)    : Takahashi, Kiyoshi; Takahashi, Kazuo It is certified that error appears in the above-identified patent and that said Letters Patent is hereby corrected as shown below:

<u>Title page,</u>
Item [73], remove "Kiyoshi Takahashi, Tokyo (JP)" as the assignee.

Signed and Sealed this

Second Day of April, 2002

*Attest:*

*Attesting Officer*

JAMES E. ROGAN
*Director of the United States Patent and Trademark Office*